United States Patent
Takemura et al.

(10) Patent No.: US 6,924,533 B2
(45) Date of Patent: Aug. 2, 2005

(54) SEMICONDUCTOR INTEGRATED CIRCUIT DEVICE INCORPORATING OVERVOLTAGE PROTECTION CIRCUIT

(75) Inventors: Ko Takemura, Kyoto (JP); Kenji Otani, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/385,435

(22) Filed: Mar. 12, 2003

(65) Prior Publication Data

US 2003/0173623 A1 Sep. 18, 2003

(30) Foreign Application Priority Data

Mar. 13, 2002 (JP) ........................................ 2002-067940

(51) Int. Cl.[7] ..................... H01L 23/62; H03K 19/0175
(52) U.S. Cl. ......................................... 257/355; 326/83
(58) Field of Search ................................ 257/355–363; 326/82, 83; 365/189.09

(56) References Cited

U.S. PATENT DOCUMENTS

| | | | | |
|---|---|---|---|---|
| 5,650,745 A | * | 7/1997 | Merrill et al. | 327/379 |
| 5,905,683 A | * | 5/1999 | McClure | 365/201 |
| 6,236,238 B1 | * | 5/2001 | Tanji et al. | 326/83 |
| 6,459,396 B2 | * | 10/2002 | Mori | 341/134 |
| 6,483,349 B2 | * | 11/2002 | Sakata et al. | 326/83 |
| 6,525,609 B1 | * | 2/2003 | Behzad | 330/254 |
| 6,535,435 B2 | * | 3/2003 | Tanaka et al. | 365/189.09 |

* cited by examiner

*Primary Examiner*—Ori Nadav
(74) *Attorney, Agent, or Firm*—Morgan, Lewis & Bockius LLP

(57) ABSTRACT

To a plurality of terminals are connected, one to one, a plurality of current mirror circuits each having a first load portion through which a first current flows when an overvoltage is applied and a second load portion through which a second current proportional to the first current flows. The first load portion of the current mirror circuit connected to one of the plurality of terminals is shared as the first load portions of the current mirror circuits connected to the others of the plurality of terminals. The shared first load portion includes an overvoltage protection circuit. The second load portions of the current mirror circuits connected to the plurality of terminals each include an overvoltage detection circuit for detecting the second current.

8 Claims, 5 Drawing Sheets

SEMICONDUCTOR INTEGRATED CIRCUIT DEVICE INCORPORATING OVERVOLTAGE PROTECTION CIRCUIT

BACKGROUND OF THE INVENTION

1. Field of the Invention

The present invention relates to a protection circuit for protecting a semiconductor integrated circuit device and its internal circuits when an overvoltage or a surge of any kind is applied to a terminal of the semiconductor integrated circuit device. The present invention relates also to a semiconductor integrated circuit device provided with such an overvoltage detection circuit.

2. Description of the Prior Art

As electronic appliances employing semiconductor integrated circuit devices become increasingly varied, and their uses become increasingly varied, more and more cases are reported in which an overvoltage in the form of noise, a surge, static electricity, or in any other form flows directly or indirectly, for example through a human body, into an electric circuit, destroying an electronic appliance or inflicting serious damage thereon. Even at manufacturing sites of electronic appliances, the measures taken against such hazards are not sufficient to satisfactorily suppress rejection rates.

For this reason, in an electronic circuit or semiconductor integrated circuit device, a terminal thereof that is likely to be exposed to an overvoltage is provided with a protection circuit to prevent an overvoltage from being applied to a functional circuit provided inside.

FIGS. 6 and 7 show conventional examples of such overvoltage protection circuits. FIG. 6 shows conventional overvoltage protection circuits. In FIG. 6, reference numeral 10 represents a semiconductor integrated circuit device having terminals "a" to "m", to each of which is connected a protection circuit composed of n Zener diodes ZD1 to ZD(n) connected together in series, with the anode of the Zener diode at the other end grounded. Though not illustrated, to each terminal is connected, in addition to one end of such a protection circuit, one end of an internal functional circuit.

In this circuit configuration, an internal circuit of the semiconductor integrated circuit device 10 is protected from a voltage higher than a predetermined voltage by setting a protection voltage that is determined by the characteristics of Zener diodes, namely, their Zener voltage and how many of them are connected together. Specifically, to protect an internal circuit of the semiconductor integrated circuit device 10 from an overvoltage higher than 100 V, for example, 10 Zener diodes that each have a Zener voltage of 10 V and that are connected together in series are connected to each of the terminals "a" to "m," so that, even when an overvoltage higher than 100 V is applied to any of the terminals "a" to "m," a reverse current flows through the Zener diodes ZD1 to ZD(n) to ground, and thus no overvoltage higher than 100 V flows into the unillustrated internal circuit. On the other hand, the normal signal voltages that are fed to the internal circuit via the terminals "a" to "m" are all lower than the protection voltage so set. Thus, for example, when a 5V signal voltage is fed to the terminal "a," no reverse current flows through the Zener diodes, and therefore the signal voltage is properly fed to the internal circuit.

FIG. 7 shows conventional overvoltage protection circuits incorporating overvoltage detection circuits. Here, such circuit elements as have the same functions as in FIG. 6 are identified with the same reference symbols. Reference numeral 11 represents a semiconductor integrated circuit device having terminals "a" to "m." To the terminal "a" is connected a protection circuit, similar to those shown in FIG. 6, composed of n Zener diodes ZD1 to ZD(n) connected together in series, with the anode of the Zener diode at the other end grounded through a resistor R1, of which one and the other ends are connected to the base and emitter, respectively, of an NPN-type transistor Qa. Though not illustrated, the collector of the transistor Qa is connected, for example, to an internal circuit of the semiconductor integrated circuit device. The circuits for the other terminals are configured likewise.

In this configuration, how the internal circuit is protected from an overvoltage by the Zener diodes is the same as in FIG. 6, and therefore no explanation of it will be repeated. Now, the overvoltage detection circuit composed of the resistor R1 and the transistor Qa will be described. When an overvoltage causes an overcurrent I1 to flow through the Zener diodes ZD1 to ZD(n) and through the resistor R1 to ground, a voltage drop of I1×R1 occurs across the resistor R1, turning the transistor Qa on. Accordingly, by connecting the collector of this transistor Qa to the unillustrated internal circuit of the semiconductor integrated circuit device, it is possible to extract an overvoltage detection signal SA to disable the internal circuit momentarily or until the entire circuit is reset.

As described above, according to the conventional technique, many Zener diodes need to be connected to each terminal that is likely to be exposed to an overvoltage. This not only makes a semiconductor integrated circuit device unduly large, but also increases the number of fabrication steps and thus costs. Moreover, variations in the characteristics of the circuit elements used cause variations in the protection voltage from one terminal to another.

SUMMARY OF THE INVENTION

An object of the present invention is to provide a semiconductor integrated circuit device provided with an overvoltage detection circuit that operates with less circuit elements and thus requires a smaller chip size, thereby permitting cost reduction, and that operates with smaller variations in the protection voltage from one terminal to another.

To achieve the above object, according to one aspect of the present invention, in a semiconductor integrated circuit device including an overvoltage protection circuit and an overvoltage detection circuit for a plurality of terminals, to a plurality of terminals are connected, one to one, a plurality of current mirror circuits each having a first load portion through which a first current flows when an overvoltage is applied and a second load portion through which a second current proportional to the first current flows. The first load portion of the current mirror circuit connected to one of the plurality of terminals is shared as the first load portions of the current mirror circuits connected to the others of the plurality of terminals. The shared first load portion includes an overvoltage protection circuit. The second load portions of the current mirror circuits connected to the plurality of terminals each include an overvoltage detection circuit for detecting the second current.

According to another aspect of the present invention, a method of fabricating a semiconductor integrated circuit device including a plurality of circuits, each composed of a protection diode and a current mirror circuit consisting of first and second transistors having bases thereof connected together, having emitters thereof connected together, and having the emitters thereof connected to an anode of the protection diode, and a plurality of terminals connected one to one to the circuits includes the steps of forming the anode of the protection diode on the semiconductor integrated circuit device, forming the cathode of the protection diode so as to surround the anode thereof, forming the collector of the first transistor so as to surround about a half of the anode within a region surrounded by the cathode, forming the collector of the second transistor so as to surround about another half of the anode, and forming the bases of the first and second transistors as a common base so as to be substantially parallel to an edge of the collectors of the first and second transistors.

According to the present invention described above, even if a plurality of terminals are likely to be exposed to an overvoltage, by sharing a protection circuit against an overvoltage, it is possible to protect the terminals individually from an overvoltage and output an overvoltage detection signal. In addition, it is possible to reduce the number of circuit elements needed, miniaturize the semiconductor integrated circuit device as a whole, reduce costs, and reduce variations in the detection voltage resulting from variations in the characteristics of the circuit elements used.

BRIEF DESCRIPTION OF THE DRAWINGS

This and other objects and features of the present invention will become clear from the following description, taken in conjunction with the preferred embodiments with reference to the accompanying drawings in which.

DESCRIPTION OF THE PREFERRED EMBODIMENTS

Figure 1:
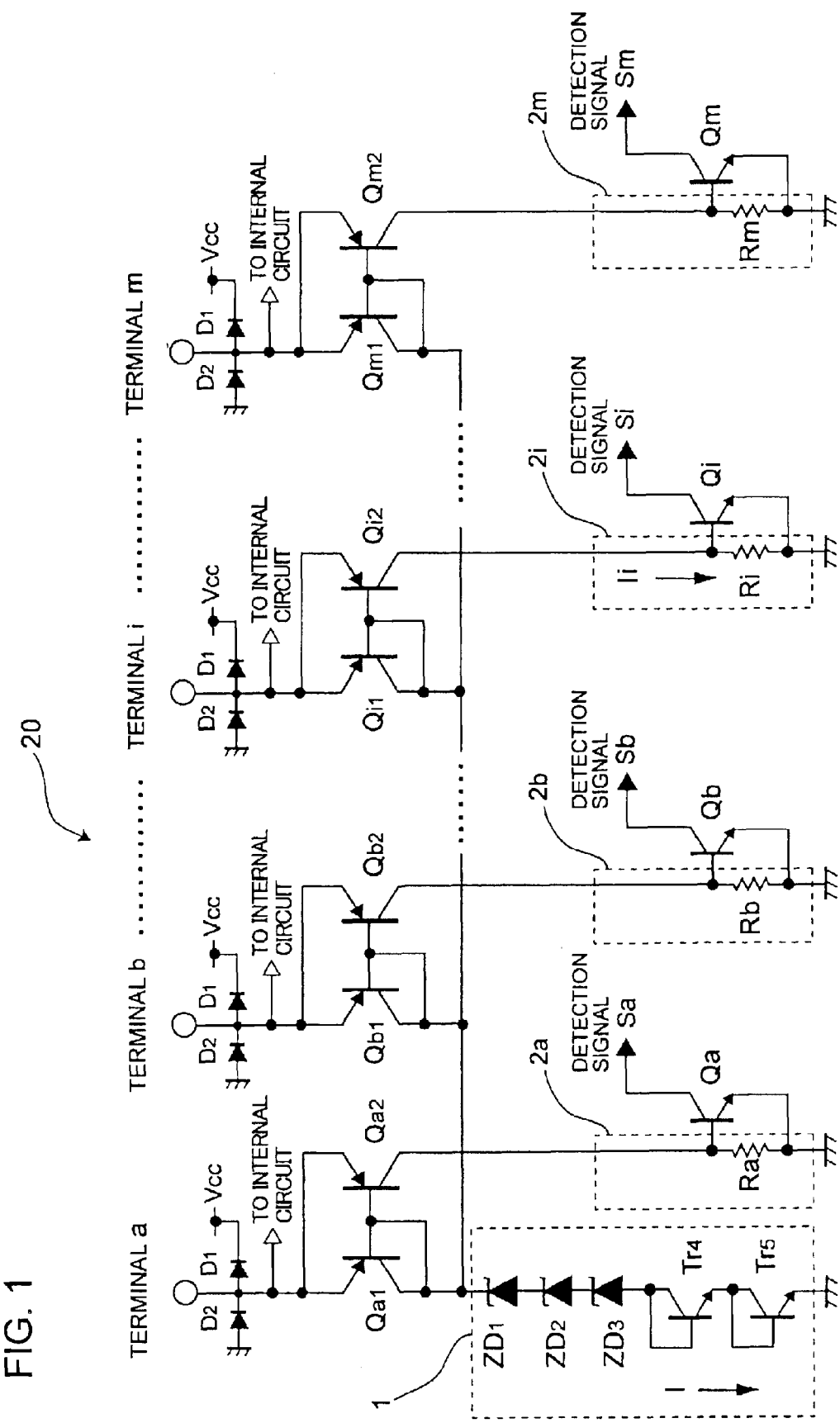
FIG. 1 shows an overvoltage protection circuit incorporating an overvoltage detection circuit, as a first embodiment of the invention.
Figure 6:
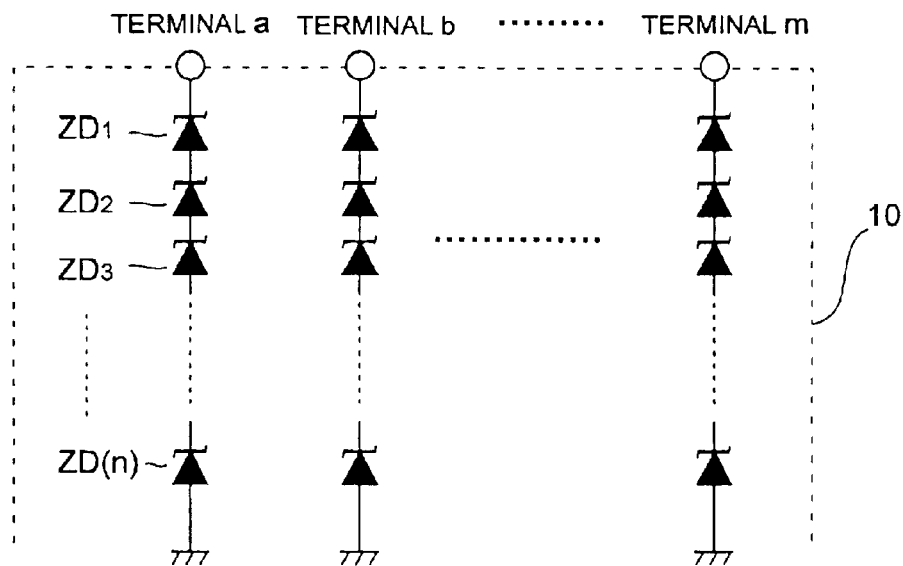
FIG. 6 shows a conventional overvoltage protection circuit.
Figure 7:
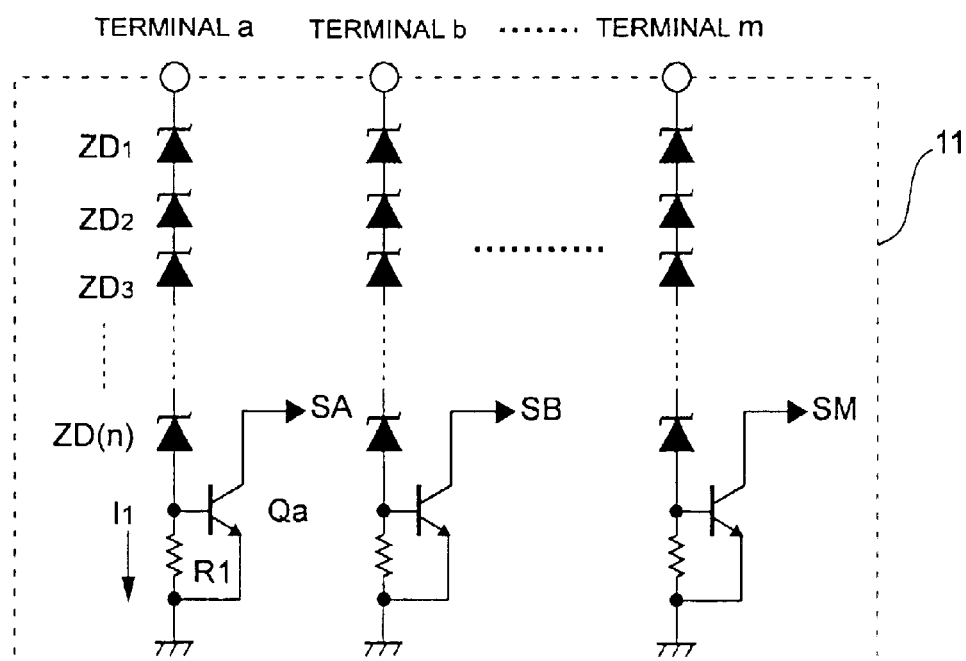
FIG. 7 shows a conventional overvoltage protection circuit incorporating an overvoltage detection circuit.

Hereinafter, embodiments of the present invention will be described with reference to the drawings. FIG. 1 shows, as a first embodiment of the invention, an overvoltage protection circuit incorporating an overvoltage detection circuit. In this figure, such circuit elements as are found in or have the same functions as in FIGS. 6 and 7 are identified with the same reference symbols, and their basic explanations will be omitted.

Reference numeral 20 represents a semiconductor integrated circuit device having terminals "a" to "m" that are likely to be exposed to an overvoltage. To the terminal "a" are connected the emitters of PNP-type transistors Qa1 and Qa2 having their emitters connected together and having their bases connected together, with their bases connected together to the collector of the transistor Qa1. Thus, the transistors Qa1 and Qa2 form a current mirror circuit having a first and a second load portions 1 and 2a on the downstream sides of the collectors of the transistors Qa1 and Qa2, respectively. The terminal "a" is connected also to an internal circuit by way of an unillustrated conductor, and to a supply voltage or ground through a protection diode or a parasitic diode.

In the first load portion 1, there are connected, on the downstream side of the collector of one transistor Qa1, three Zener diodes ZD1 to ZD3 that are connected together in series and, further on the downstream side thereof, NPN-type transistors Tr4 and Tr5 that are connected together in series and that each have their collector and base connected together, with the emitter of the transistor Tr5 grounded. On the other hand, in the second load portion 2a, there is connected, on the downstream side of the transistor Qa2, a resistor Ra through which the collector of the transistor Qa2 is grounded. One end of the resistor Ra is connected to the base of an NPN-type transistor Qa, and the other end of the resistor Ra is connected to the emitter of the transistor Qa. Thus, when application of an overvoltage to the terminal "a" is detected, the transistor Qa outputs an overvoltage detection signal Sa through its collector.

The circuits for the terminals "b" to "m" are configured as follows. Here, the circuit for the terminal "i" is taken up as the representative. As with the terminal "a," to the terminal "i" are connected the emitters, connected together, of PNP-type transistors Qi1 and Qi2 forming a current mirror circuit, and the bases thereof, connected together, are connected to the first load portion, which is shared as a common circuit portion among the circuits for the other terminals "a" to "h" and "j" to "m." On the other hand, as with the terminal "a," in the second load portion 2i for the transistor Qi2, one end of a resistor Ri is connected to the collector of the transistor Qi2, and the other end of the resistor Ri is grounded, with one and the other ends of the resistor Ri also connected to the base and emitter, respectively, of an NPN-type transistor Qi. Here, when an overvoltage is applied to the terminal "i," the transistor Qi outputs an overvoltage detection signal Si through its collector.

Next, the operation of the circuit described above will be described. Now, suppose that to the terminal "i" is applied a voltage Vi higher than the sum of the voltages Vq1, VT4, and VT5 that respectively turn the transistors Qi1, Tr4, and Tr5 on and the Zener voltages VD1, VD2, and VD3 that respectively turn on the Zener diodes ZD1 to ZD3. Then, a current I flows from the collector of the transistor Qi1 through the Zener diodes ZD1 to ZD3 and then through the transistors Tr4 and Tr5 to ground. Simultaneously, from the collector of the transistor Qi2, which together with the transistor Qi1 forms a current mirror circuit, a current Ii proportional to the current I flows through the resistor Ri to ground. This causes a voltage drop to occur across the resistor Ri and thereby turns the transistor Qi on, making it output an overvoltage detection signal Si.

As described above, in the first embodiment of the invention, the first load portion 1 of the current mirror circuit connected to one of the terminals of the semiconductor integrated circuit device is provided with an overvoltage protection circuit composed of Zener diodes, and is shared as the first load portions of the current mirror circuits connected to the other terminals. On the other hand, the second load portions 2a to 2m of all the current mirror circuits are each provided with an overvoltage detection circuit composed of a resistor and a transistor. This eliminates the need to provide many Zener diodes for each terminal. Even then, when an overvoltage is applied to a terminal, it is possible to securely protect the internal circuit connected to the terminal, and it is also possible to detect an overvoltage terminal by terminal. Moreover, the protection voltage does not vary from terminal to terminal, and therefore it is possible to achieve highly accurate protection against and detection of an overvoltage.

Next, with reference to FIGS. 2 and 3, a second embodiment of the invention will be described. In the configuration shown in FIG. 2, fuses are used in place of the circuits that output overvoltage detection signals.

Figure 2:
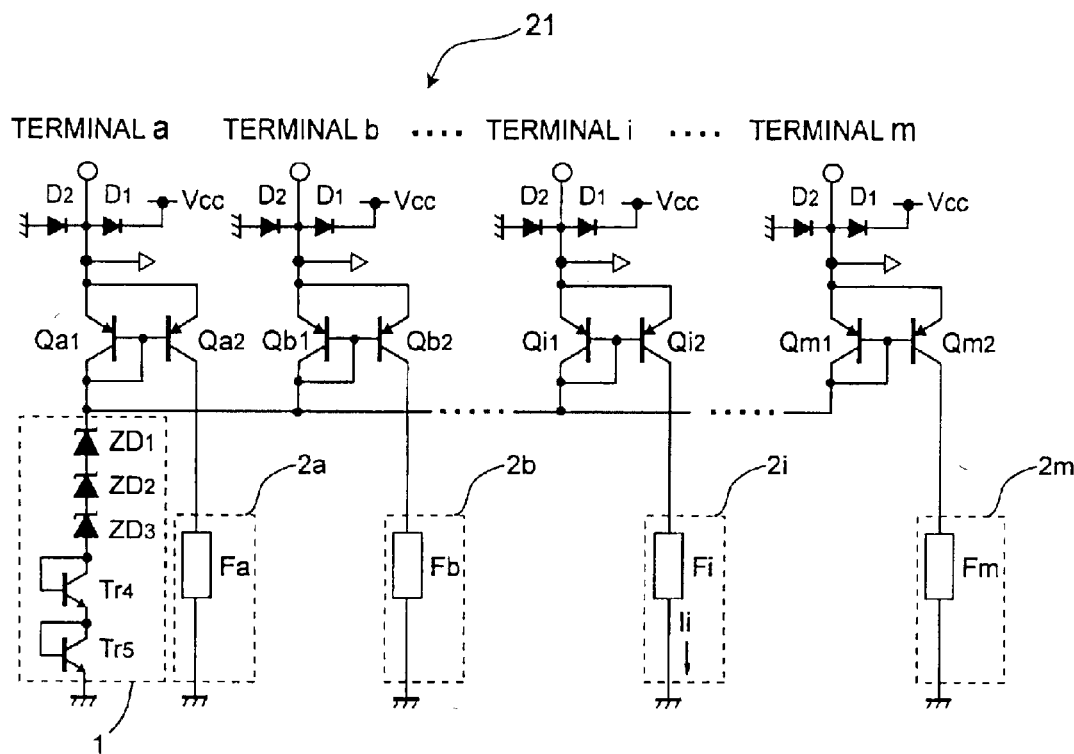
FIG. 2 shows an overvoltage protection circuit incorporating an overvoltage-blowing fuse, as one example of a second embodiment of the invention.

FIG. 2 shows one example of the circuit configuration of the second embodiment. Here, the resistor Ri and the transistor Qi of the second load portion 2i are replaced with a fuse Fi. In the semiconductor integrated circuit device 21 configured in this way, for example, when an overvoltage is applied to the terminal "i," the transistors Qi1 and Qi2 forming a current mirror circuit, the Zener diodes ZD1 to ZD3, and the transistors Tr4 and Tr5 operate just as described earlier. Here, by arranging the fuse Fi, which blows when the current Ii flows through the collector of the transistor Qi2, in the second load portion 2i provided on the downstream side thereof, it is possible to use the fuse Fi as a storage means for storing whether an overvoltage has ever been detected or not. This makes it possible to inspect the individual terminals later to identify those to which an overvoltage has ever been applied.

Figure 3:
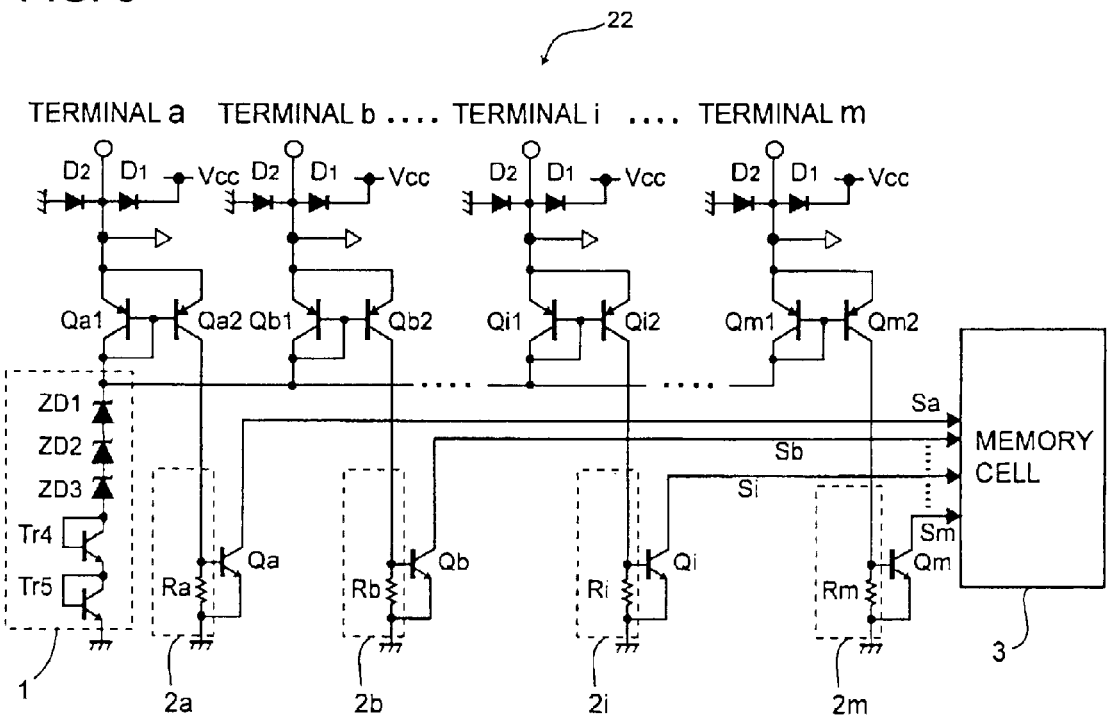
FIG. 3 is an overvoltage protection circuit incorporating a memory cell for storing a history of overvoltages, as another example of the second embodiment of the invention.

FIG. 3 shows another example of the circuit configuration of the second embodiment. The configuration and operation here are the same as in the first embodiment except that the overvoltage detection signal Si is fed to a memory cell 3 provided as a storage means within the semiconductor integrated circuit device 22. Here, the overvoltage detection signal Si output from the transistor Qi is stored in the memory cell as a history of overvoltages applied to the terminal "i." Thus, by inspecting the individual terminals later, it is possible to identify those to which an overvoltage has ever been applied. If the memory cell is so configured as to store the number of times that overvoltages have been detected at each terminal and is furnished with a calendar function, it is possible to store the dates and times that overvoltages were detected as a history that can be read out by the use of an unillustrated reading circuit.

In the first and second embodiments, the first load portion 1 is composed of PNP- or NPN-type bipolar transistors and three Zener diodes. However, the first load portion 1 may be configured in any other manner than specifically described above; for example, it may include, depending on the type of the semiconductor integrated circuit device, a P- or N-channel MOS transistor or any number of Zener diodes or diodes.

Figure 4C:
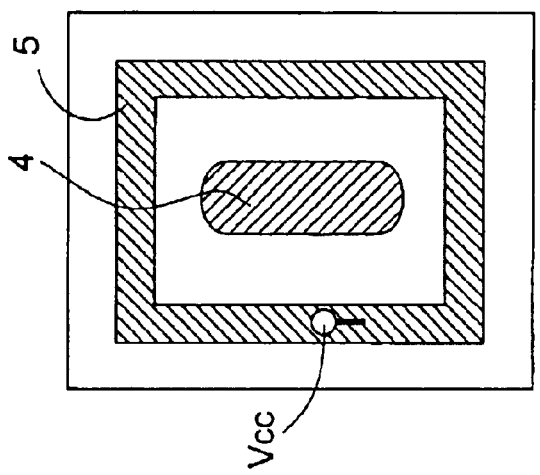
FIG. 4C is a top view of the semiconductor integrated circuit device.
Figure 4B:
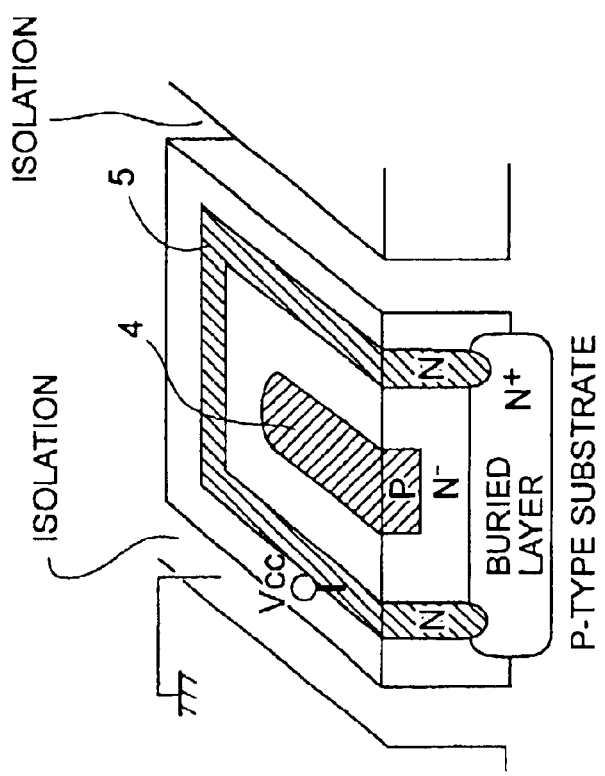
FIG. 4B is a sectional view of the semiconductor integrated circuit device.
Figure 4A:
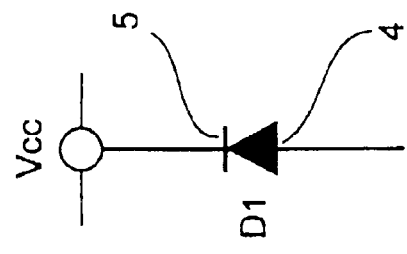
FIG. 4A is a diagram showing an equivalent circuit of the overvoltage protection diode.
Figure 5C:
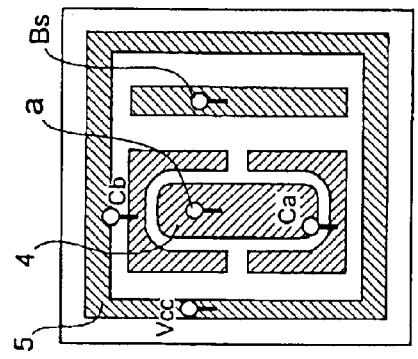
FIG. 5C is a top view of the semiconductor integrated circuit device of the third embodiment.
Figure 5B:
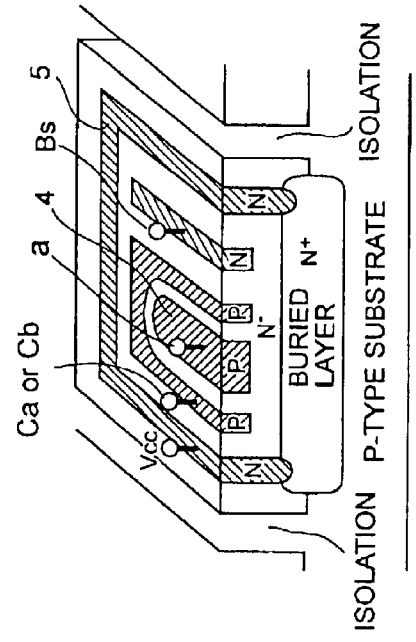
FIG. 5B is a sectional view of the semiconductor integrated circuit device of the third embodiment.
Figure 5A:
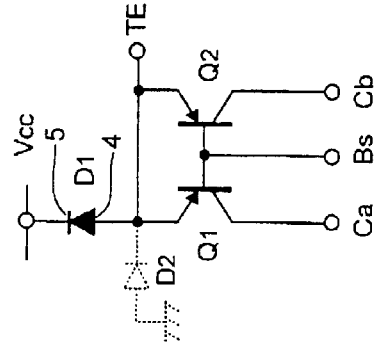
FIG. 5A is an equivalent circuit of the overvoltage protection diode and the current mirror circuit used in a third embodiment of the invention.
Figure 5E:
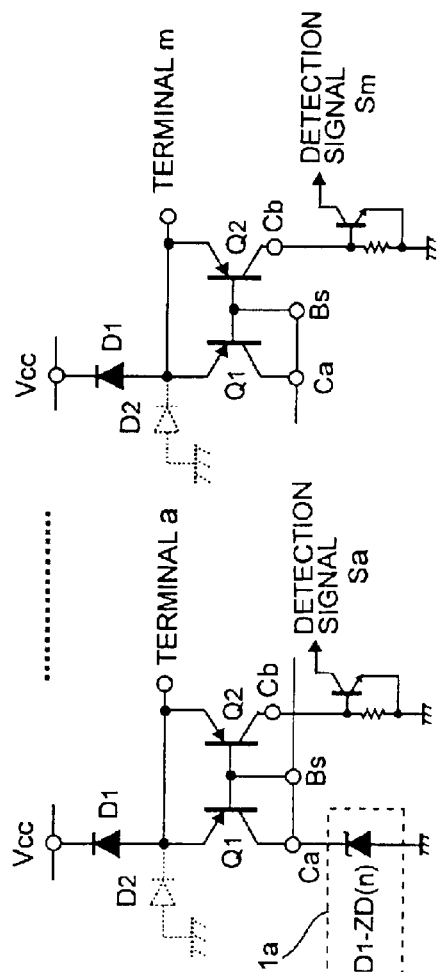
FIG. 5E shows practical example 2 of the semiconductor integrated circuit device of the third embodiment.
Figure 5D:
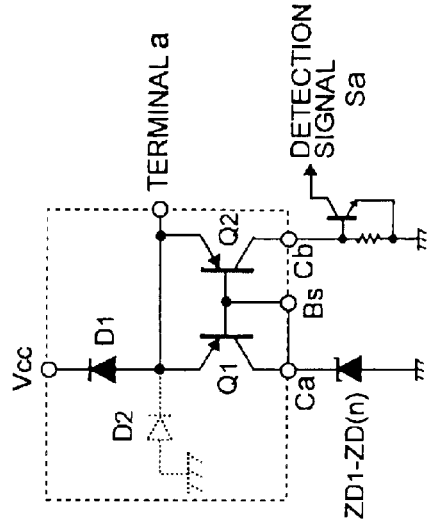
FIG. 5D shows practical example 1 of the semiconductor integrated circuit device of the third embodiment.

Next, with reference to FIGS. 4A to 4C and 5A to 5E, a third embodiment of the invention will be described. FIGS. 4A to 4C show a protection diode used as a protection against an overvoltage applied to the supply voltage of the semiconductor integrated circuit device. More specifically, FIG. 4A is an equivalent circuit, FIG. 4B is a sectional view of the semiconductor integrated circuit device, and FIG. 4C is a top view thereof. FIGS. 5A to 5E show a structure in which two transistors forming a current mirror circuit are formed in the structure of the diode shown in FIGS. 4A to 4C formed in the semiconductor integrated circuit device. FIG. 5A is an equivalent circuit, FIG. 5B is a sectional view of the semiconductor integrated circuit device, FIG. 5C is a top view thereof, FIG. 5D shows practical example 1 of a circuit to which the third embodiment is applied, and FIG. 5E shows practical example 2 of such a circuit.

In a semiconductor integrated circuit device, a surge voltage resulting from static electricity or the like occasionally appears at a supply-power or ground terminal or at any other terminal. For this reason, in a conventional circuit, in general, the cathode electrode of a protection diode D1 as shown in FIG. 4A is connected to a supply voltage terminal Vcc or any other terminal that is likely to be exposed to a surge voltage, and the anode electrode 4 of the protection diode D1 is grounded through a resistor or the like. This permits a surge voltage higher than the breakdown voltage of the diode to be absorbed by the diode. An example of the structure of such a protection diode formed in a semiconductor integrated circuit device will be described with reference to FIGS. 4B and 4C. In this example, on a P-type semiconductor substrate, an $N^+$-type buried layer is laid, and then an $N^-$-type layer is laid. Further on top of this $N^-$-type layer, the P-type anode electrode 4 of the protection diode D1 is formed, and then the N-type cathode electrode 5 thereof, which is connected to the supply power terminal Vcc, is formed so as to surround the anode electrode 4.

In the third embodiment, in the structure described above, to detect an overvoltage, as shown in FIG. 5A, PNP-type transistors Q1 and Q2 that form a current mirror circuit are formed within the region surrounded by the cathode electrode 5 of the diode D1.

FIGS. 5B and 5C show an example of the structure of the semiconductor integrated circuit device. In this example, within the region surrounded by the cathode electrode 5, which is connected to the supply voltage terminal Vcc, of the protection diode D1 described above with reference to FIGS. 4A to 4C, the collector electrodes Ca and Cb of two independent P-type transistors Q1 and Q2 are formed so as to again surround the anode electrode 4 of the protection diode D1, and, parallel to these collector electrodes Ca and Cb, an N-type common base electrode Bs of the transistors Q1 and Q2 is formed. In this way, the transistors Q1 and Q2 having their bases connected together and having their emitters connected together are formed.

FIG. 5A is an equivalent circuit of FIGS. 5B and 5C. In actual use, as shown in FIG. 1, the protection voltage may be raised by connecting Zener diodes or transistors on the downstream side of the collector electrode Ca, and an overvoltage detection signal may be output by connecting the collector electrode Cb to the second load portion composed of a resistor and an output circuit composed of a transistor. That is, the circuit configuration may be modified to suit the intended purpose. In that case, when an overvoltage is applied to this circuit via the terminal "a" or the supply voltage terminal Vcc, it causes a current to flow through the protection diode D1 and through the unillustrated circuit elements connected on the downstream side of the collector of the transistor Q1 to ground. Simultaneously, a current proportional to that current flows through the collector of the transistor Q2 and through unillustrated circuit elements to ground. Thus, this current can be detected to output an overvoltage detection signal.

As in practical example 1 shown in FIG. 5D, the circuit configuration of this embodiment may be applied to a plurality of terminals that are likely to be exposed to an overvoltage. Here, $ZD_1$-$ZD(n)$ represent that n Zener diodes are connected together according to the magnitude of the expected overvoltage. Moreover, here, the diode D2 that functions as a protection diode is shown as a parasitic diode that appears in the semiconductor integrated circuit device, and is therefore indicated with broken lines. Alternatively, as practical example 2 shown in FIG. 5E, i.e., as in the first embodiment, the Zener diodes $ZD_1$-$ZD(n)$ for absorbing an overvoltage may be inserted in the first load portion 1a of the current mirror circuit connected to one of terminals "a" to "m" so that this first load portion 1a is shared as those of the current mirror circuits connected to the other terminals.

In the third embodiment, when a protection diode is formed in a semiconductor integrated circuit device, transistors forming a current mirror circuit are formed simultaneously within the region in which the protection diode is formed. This makes it possible to form a protection circuit for protecting an internal circuit from an overvoltage applied thereto via a terminal of the semiconductor integrated circuit device together with a current mirror circuit in a small area, contributing to miniaturization of the semiconductor integrated circuit device.

As described above, with a semiconductor integrated circuit device incorporating an overvoltage detection circuit according to the present invention, even if a plurality of terminals are likely to be exposed to an overvoltage, by sharing a protection circuit against an overvoltage, it is possible to protect the terminals individually from an overvoltage and output an overvoltage detection signal with a reduced number of circuit elements. Moreover, it is possible to miniaturize the semiconductor integrated circuit device as a whole, reduce costs, and reduce variations in the detection voltage resulting from variations in the characteristics of the circuit elements used.

What is claimed is:

1. A semiconductor integrated circuit device, comprising:
   a plurality of terminals each connected to each of a plurality of internal circuits;
   a plurality of current mirror circuits, each connected to each of the plurality of terminals and each comprising an input-side circuit into which a first current flows from a terminal to which each current mirror circuit is connected and an output-side circuit into which a second current proportional to the first current flows from the terminal to which said each current mirror circuit is connected when an overvoltage is applied to the terminal to which said each current mirror circuit is connected;
   a single first load shared by all of the plurality of current mirror circuits and connected between each input-side circuit of all of the plurality of current mirror circuits and ground so as to permit the first current fed out from any one of input-side circuits to flow through the first load; and
   a plurality of second loads each of which connected between each output-side circuit of all of the plurality of current mirror circuits and ground so as to permit the second current fed out from an output-side circuit corresponding to said any one of input-side circuits to flow through a second load thereof, wherein, when an overvoltage is applied to one of the plurality of terminals, a current mirror circuit connected thereto permits a first current and a second current to flow therethrough by way of an input-side circuit and an output-side circuit included therein respectively,
   the first load by being comprised of an overvoltage protection circuit protects an internal circuit connected to said one of the plurality of terminals from the overvoltage by permitting said first current to flow therethrough to ground, and
   the second load by being comprised of an overvoltage detection circuit detects the overvoltage by permitting said second current to flow therethrough to ground.

2. A semiconductor integrated circuit device as claimed in claim 1,
   wherein each of the plurality of current mirror circuits is composed of a first transistor forming the input-side circuit and a second transistor forming the output-side circuit respectively having bases thereof connected together and having emitters thereof connected together,
   the first load having one end thereof connected to a node between a collector of the first transistor and the bases of the first and second transistors connected together, and having another end thereof grounded;
   the second load having one end thereof connected to a collector of the second transistor, and having another end thereof grounded.

3. A semiconductor integrated circuit device as claimed in claim 1, further comprising:
   first protection diodes having anodes thereof connected one to one to the plurality of terminals and having cathodes thereof connected to a supply voltage; and/or
   second protection diodes having cathodes thereof connected one to one to the plurality of terminals and having anodes thereof grounded.

4. A semiconductor integrated circuit device as claimed in claim 1,
   wherein the first load includes a Zener diode or a plurality of Zener diodes connected together in series.

5. A semiconductor integrated circuit device as claimed in claim 1,
   wherein the second load includes a resistor.

6. A semiconductor integrated circuit device as claimed in claim 5,
   wherein the overvoltage detection circuit operates by detecting a voltage drop that occurs across the resistor when the second current flows.

7. A semiconductor integrated circuit device as claimed in claim 6, further comprising: a memory cell to which is written a history of application of overvoltages as detected by the overvoltage detection circuit.

8. A semiconductor integrated circuit device as claimed in claim 1,
   wherein the second load is composed of a fuse that blows when a predetermined level of current flows as the second current.

* * * * *